(12) United States Patent
Forbes

(10) Patent No.: US 6,912,158 B2
(45) Date of Patent: Jun. 28, 2005

(54) TRANSISTOR WITH NANOCRYSTALLINE SILICON GATE STRUCTURE

(75) Inventor: Leonard Forbes, Coryallis, OR (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 10/453,324

(22) Filed: Jun. 3, 2003

(65) Prior Publication Data

US 2003/0206445 A1 Nov. 6, 2003

Related U.S. Application Data

(63) Continuation of application No. 10/176,425, filed on Jun. 18, 2002, now Pat. No. 6,574,144, which is a division of application No. 09/145,722, filed on Sep. 2, 1998, now Pat. No. 6,407,424, which is a continuation of application No. 08/790,500, filed on Jan. 29, 1997, now Pat. No. 5,852,306.

(51) Int. Cl.[7] .............................................. G11C 16/04
(52) U.S. Cl. ........................... 365/185.18; 365/185.26; 365/185.33; 257/315; 257/316; 257/321
(58) Field of Search ...................... 365/185.18, 185.26, 365/185.33; 257/315, 316, 321, 322, 324

(56) References Cited

U.S. PATENT DOCUMENTS

| | | | |
|---|---|---|---|
| 4,688,078 A | 8/1987 | Hseih | 357/23.5 |
| 5,021,999 A | 6/1991 | Kohda et al. | 365/168 |
| 5,027,171 A | 6/1991 | Reedy et al. | 357/23.5 |
| 5,111,430 A | 5/1992 | Morie | 365/185 |
| 5,253,196 A | 10/1993 | Shimabukuro | 365/45 |
| 5,293,560 A | 3/1994 | Harari | 365/185 |
| 5,295,095 A | 3/1994 | Josephson | 326/50 |
| 5,317,535 A | 5/1994 | Talreja et al. | 365/185 |
| 5,388,069 A | 2/1995 | Kokubo | 365/185 |
| 5,424,993 A | 6/1995 | Lee et al. | 365/218 |
| 5,430,670 A | 7/1995 | Rosenthal | 365/45 |
| 5,434,815 A | 7/1995 | Smarandoiu et al. | 365/189.01 |
| 5,438,544 A | 8/1995 | Makino | 365/185 |
| 5,444,303 A | 8/1995 | Greenwood et al. | 257/786 |
| 5,467,306 A | 11/1995 | Kaya et al. | 365/185.2 |
| 5,477,485 A | 12/1995 | Bergemont et al. | 365/185.24 |
| 5,485,422 A | 1/1996 | Bauer et al. | 365/168 |
| 5,493,140 A | 2/1996 | Iguchi | 257/316 |
| 5,508,543 A | 4/1996 | Hartstein et al. | 257/314 |
| 5,511,020 A | 4/1996 | Hu et al. | 365/185.28 |
| 5,627,781 A | 5/1997 | Hayashi et al. | 365/185.2 |
| 5,670,790 A | 9/1997 | Katoh et al. | 257/14 |
| 5,714,766 A | 2/1998 | Chen et al. | 257/20 |
| 5,726,070 A | 3/1998 | Hong et al. | 437/43 |
| 5,754,477 A | 5/1998 | Forbes | 365/185.33 |
| 5,801,401 A | 9/1998 | Forbes | 257/77 |
| 5,852,306 A | 12/1998 | Forbes | 257/315 |
| 5,937,295 A | 8/1999 | Chen et al. | 438/257 |
| 6,114,722 A | 9/2000 | Jan et al. | 257/315 |
| 6,297,095 B1 | 10/2001 | Muralidhar et al. | 438/257 |
| 6,344,403 B1 | 2/2002 | Madhukar et al. | 438/503 |
| 6,407,424 B2 * | 6/2002 | Forbes | 257/315 |

OTHER PUBLICATIONS

Alivisatos, A. P., "Semiconductor Clusters, Nanocrystals, and quantum Dots", *Science*, vol. 271, (Feb. 16, 1996), 933–937.

(Continued)

*Primary Examiner*—Vu A. Le
*Assistant Examiner*—Toan Le
(74) *Attorney, Agent, or Firm*—Schwegman, Lundberg, Woessner & Kluth, P.A.

(57) ABSTRACT

A memory is described which has memory cells that store data using hot electron injection. The data is erased through electron tunneling. The memory cells are described as floating gate transistors wherein the floating gate is fabricated using a conductive layer of nanocrystalline silicon particles. Each nanocrystalline silicon particle has a diameter of about 10 Å to 100 Å. The nanocrystalline silicon particles are in contact such that a charge stored on the floating gate is shared between the particles. The floating gate has a reduced electron affinity to allow for data erase operations using lower voltages.

42 Claims, 3 Drawing Sheets

OTHER PUBLICATIONS

Alok, D., et al., "Electrical Properties of Thermal Oxide Growth on N–type 6H–Silicon Carbide", *Applied Physcis Letters, 64*, (May 23, 1994),2845–2846.

Baldwin, G. L., et al., "The Electronic Conduction Mechanism of Hydrogenated Nanocrystalline Silicon Films", *Proc. 4th Int. Conf. on Solid–State and Int. Circuit Tech, Beijing*, (1995),66–68.

Bauer, M. , et al., "A Multilevel–Cell 32 Mb Flash Memory", *Digest IEEE*, Solid–State Circuits Conf.,,(1995), 440.

Boeringer, Daniel W., et al., "Avalanche amplificaiton of multiple resonant tunneling through parallel silicon microcrystallites", *Physical Rev. B, 51*, (1995),13337–13343.

Demichelis, F. , "Influence of Doping on the Structural and Optoelectronic Properties of Amorphous and Microcrystalline Silicon Carbide", *Journal of Applied Physics, 72*, (Aug. 15, 1992), 1327–1333.

Demichelis, F., "Physical Properties of Undoped and Doped Microcrystalline SiC:H Deposited by PECVD", *Materials Research Society Symposium Proceedings, 219*, Anaheim, CA,(Apr. 30–May 3, 1991),413–418.

Dimaria, D. J., et al., "ced conduction and minimized charge trapping in electrically alterable only memories using offstoichiometric silicon dioxide films", *J. Appl. Phys., vol. 55, No. 8*, (Apr. 15, 1984),3000–3019.

Dipert, Brian, "Flash Memory Goes Mainstream", *IEEE Spectrum, 30(10)*, (Oct. 1993),48–52.

Dori, Leonello , et al., "Optimized Silicon–Rich Oxide (SRO) Deposition processor 5–V–Only Flash EEPROM Applications", *IEEE Elect. Dev. Let.* vol. 14, No. 6, (1993), 283–285.

Edelbert, E. , et al., "Visible Luminescence from Nanocrystalline silicon films produced by plasma enhanced chemical vapor deposition", *Appl. Phys. Lett., 68*, (1996),1415–1417.

Hamakawa, Y. , et al., "Optoelectronics and Photovoltaic Applications of Microcrystalline SiC", *Materials Research Society Symposium Proceedinigs, 164*, Boston, MA,(Nov. 29–Dec. 1, 1989),291–301.

Hu, G. , et al., "Will Flash Memory Replace Hard Disk Drive?", *1994 IEEE International Electron Device Meeting*, Panel Discussion, Session 24, Outline,(Dec. 1994),2 pages.

Hybertsen, Mark S., "Absorption and Emission of Light in Nanoscale Silicon Structures", *Phys. Rev. Lett., 72*, (1994), 1514–1517.

Jung, T S., et al., "A 3.3V, 128Mb Multi–Level NAND Flash Memory for Mass Storage Applications", *1996 IEEE Solid–State Circuits Conf.*, Digest of Technical Papers,(1996), 512.

Kamata, T. , et al., "Substrate Current Due to Impact Ionization in MOS–FET", *Japan. J. Appl. Phys., 15*, (Jun. 1976),1127–1134.

Kato, Masataka, et al., "Read–Disturb Degradation Mechanism due to Electron Trapping in the Tunnel Oxide for Low–voltage Flash Memories", *IEEE Electron Device Meeting*, (1994),45–48.

Mori, Seiichi , et al., "Polyoxide Thinning Limitation and Superior ONO Interpoly Dielectric for Nonvolatile Memory Devices", *IEEE Trans. Elec. Dev.* vol. 38, No. 2, (1991), 270–277.

Ohkawa, M. , et al., "A 98 mm 3.3V 64Mb Flash Memory with FN–NOR type 4–Level Cell", *IEEE International Solid–State Circuits Conference*, (1996),36–37.

Pan, Cheng–Sheng , et al., "A Scaling Methodology for Oxide–Nitride–Oxide Interpoly Dieelectric for EPROM Applications", *IEEE, Trans. Elect. Dev.*, vol. 37, No. 6, (1990),1439–1443.

Prendergast, Jim , "FLASH or DRAM: Memory Choice for the Future", *IEEE Electron Device Meeting, Session 25*, Phoenix, AZ,(1995),.

Schoenfeld, O. , et al., "Formation of Si Quantum dots in Nanocrystalline silicon", *Proc. 7th Int. Conf. on Modulated Semiconductor Structures, Madrid*, (1995),605–608.

Shen, S. , et al., "Novel Self–Convergent Programming Scheme for Multi–Level P–Channel Flash Memory", *International Electron Devices Meeting, Technical Digest*, Held in Washington, D.C.,(Dec. 7–10, 1997),287–290.

Shen, Shih–Jye , et al., "Ultra fast write speed, long refresh time, low power F–N operated volatile memory cell with stacked nanocrystalline Si film", *IEEE IEDM*, Dec. 8, 1996), 515–518.

Shimabukuro, R. L., et al., "Circuitry for Artificial Neural Networks with Non–volatile Analog Memories", *IEEE Int'l Symp. on Circuits and Systems, 2*, (1989),1217–1220.

Shimabukuro, R. L., et al., "Dual–Polarity Nonvolatile MOS Analogue Memory (MAM) Cell for Neural–Type Circuitry", *Electronics Lett., 24*, (Sep. 15, 1988),1231–1232.

Suh, K. D., et al., "A 3.3 V 32 Mb NAND Flash Memory with Incremental Step Pulse Programming Scheme", *IEEE J. Solid–State Circuits, 30*, (Nov. 1995), 1149–1156.

Sze, S. M., "Physics of Semiconductor Devices", *Wiley-Interscience 2d Ed.*, New ork,(1981),482.

Takeuchi, K. , et al., "A Double–Level–V Select Gate Array Architecture for Multilevel NANAD Flash Memories", *IEEE Journal of Solid–State Circuits, 31*, (Apr. 1996), 602–609.

Tiwari, Sandip , et al., "Volatile.and Non–Volatile memories in Silicon with Nano–Crystal Storage", *Int'l Electron Devices Meeting: Technical Digest*, Washington, DC,(Dec. 1995),521–524.

Tsu, Raphael, et al., "Slow Conductance oscillations in nanoscale silicon clusters of quantum dots", *Appl. Phys. Lett., 65*, (1994),842–844.

Tsu, R. , et al., "Tunneling in Nanoscale Silicon Particles Embedded in an a–SiO2 Matrix", *Abstract, IEEE Device Research Conference*, (1996),pp. 178–179.

White, W. , et al. "Ion beam synthesis of nanocrystals and quantum dots in optical materials", *Proceedings of the 11th Int'l Conf. on ion implantation technology*, Jun. 16, 1996), 824–827.

Yee, A. , et al., "The Effect of Nitrogen on Pulsed Laser Deposition of Amorphous Silicon Carbide Films: Properties and Structure", *J. Materials Research, 11*, (1996),1979–1986.

YIH, C. M., et al., "A Consistent Gate and Substrate Current Model for Sub–Micron MOSFET'S by Considering Energy Transport", *Int'l Symp. on VLSI Tech., Systems and Applic.*, Taiwan,(1995),127–130.

Zhao, X. , et al., "Nanocrystalline Si: a material constructed by Si quantum dots", *1st Int. Conf. on Low Dimensional Structures and Devices, Singapore*, (1995),467–471.

\* cited by examiner

TRANSISTOR WITH NANOCRYSTALLINE SILICON GATE STRUCTURE

CROSS-REFERENCE TO RELATED APPLICATION(S)

This patent application is a continuation of U.S. patent application Ser. No. 10/176,425 filed Jun. 18, 2002 now U.S. Pat. No. 6,874,144 which is a division of U.S. patent application Ser. No. 09/145,722, filed on Sep. 2, 1998, now U.S. Pat. No. 6,407,424 which is a continuation of U.S. patent application Ser. No. 08/790,500, filed on Jan. 29, 1997, now issued as U.S. Pat. No. 5,852,306, the specifications of which are hereby incorporated by reference.

TECHNICAL FIELD OF THE INVENTION

The present invention relates generally to memory circuits and in particular the present invention relates to floating gate memory cells.

BACKGROUND OF THE INVENTION

Non-volatile memory such as electrically programmable read-only memory (EPROM) and electrically-erasable programmable read-only memory (EEPROM) are extensively used for storing data in computer systems. EPROM and EEPROM comprise a large number of memory cells having electrically isolated gates, referred to as floating gates. Data is stored in the memory cells in the form of charge on the floating gates. Charge is transported to or removed from the floating gates by program and erase operations, respectively.

Another type of non-volatile memory is flash memory. Flash memory is a derivative of EPROM and EEPROM. Although flash memory shares many characteristics with EPROM and EEPROM, the current generation of flash memory differs in that erase operations are done in blocks.

A typical flash memory comprises a memory array which includes a large number of memory cells arranged in row and column fashion. Each of the memory cells include a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memories have the potential of replacing hard storage disk drives in computer systems. The advantages would be replacing a complex and delicate mechanical system with a rugged and easily portable small solid-state non-volatile memory system. There is also the possibilities that given their very high potential densities that given more speed of operation particularity in the erase operation that flash memories might be used to replace DRAMs. Flash memories might then have the ability to fill all memory needs in future computer systems.

One flash memory is described in S. Tiwari et al., "Volatile and Non-volatile Memories in Silicon with Nano-Crystal Storage," Abstr. of IEEE Int. Electron Device Meeting, pp. 521–524 (1995), which uses confined nano-crystal particles in a floating gate memory cell. The individual nano-crystals are not in electrical contact with each other, and therefore cannot share a common charge. As referred to in the art, the memory has a thin gate oxide and uses a tunnel-tunnel process for writing and reading data. A memory designed to use a tunnel-tunnel process typically has a gate oxide thickness of about 15–20 Å which can be degraded over time resulting in a defective memory.

For the reasons stated above, and for other reasons stated below which will become apparent to those skilled in the art upon reading and understanding the present specification, there is a need in the art for a fast flash memory having a floating gate memory cell which in which the floating gate has a reduced electron affinity, can share a common charge, or does not use a tunnel-tunnel process.

SUMMARY OF THE INVENTION

The above mentioned problems with memory devices and other problems are addressed by the present invention and which will be understood by reading and studying the following specification. A memory cell is described which uses a film of nanocrystalline silicon as a floating gate.

In particular, the present invention describes an integrated circuit memory cell comprising a transistor having a source, drain, gate and a floating gate, the floating gate comprising a film of nanocrystalline silicon particles. The nanocrystalline silicon particles are in contact to form a conductive film.

In another embodiment, an integrated circuit field effect transistor is described. The transistor comprises a conductive channel separating source and drain regions, a floating gate comprising a conductive film of nanocrystalline silicon particles. The floating gate is located adjacent the channel and separated therefrom by a first insulating layer. A gate is provided adjacent the floating gate and separated therefrom by a second insulating layer.

In yet another embodiment, a memory device is described which has an array of memory cells. Each of the memory cells comprise a source region, a drain region, a conductive channel separating the source and drain regions, and a floating gate comprising a conductive film of nanocrystalline silicon particles. The floating gate is located adjacent the channel and separated therefrom by a first insulating layer. A gate is also located adjacent the floating gate and separated therefrom by a second insulating layer. The memory further comprises addressing circuitry for addressing the array of memory cells, and control circuitry for controlling read and write operations of the memory device.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
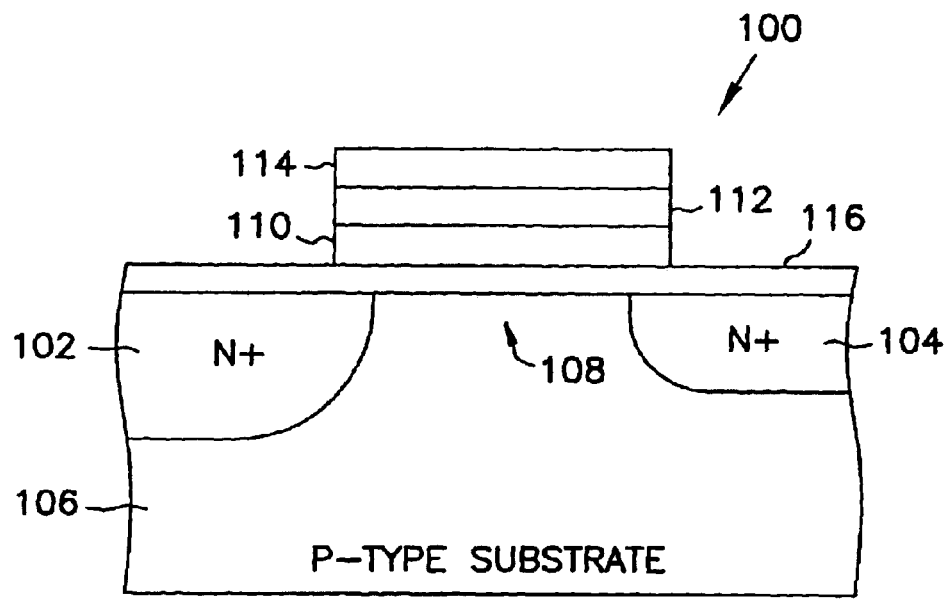
FIG. 1 is a cross-sectional view of a prior art memory cell.

FIG. 1 is a cross-sectional view of a typical memory cell, such as used in a flash memory. Memory cell 100 comprises a region of a source 102 and a region of a drain 104. Source 102 and drain 104 are constructed from an N+ type of high impurity concentration which are formed in a P-type semiconductor substrate 106 of low impurity concentration. Source 102 and drain 104 are separated by a predetermined space of a channel region 108. Memory 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin oxide layer 116 approximately 100 angstroms (Å) thick.

Figure 2:
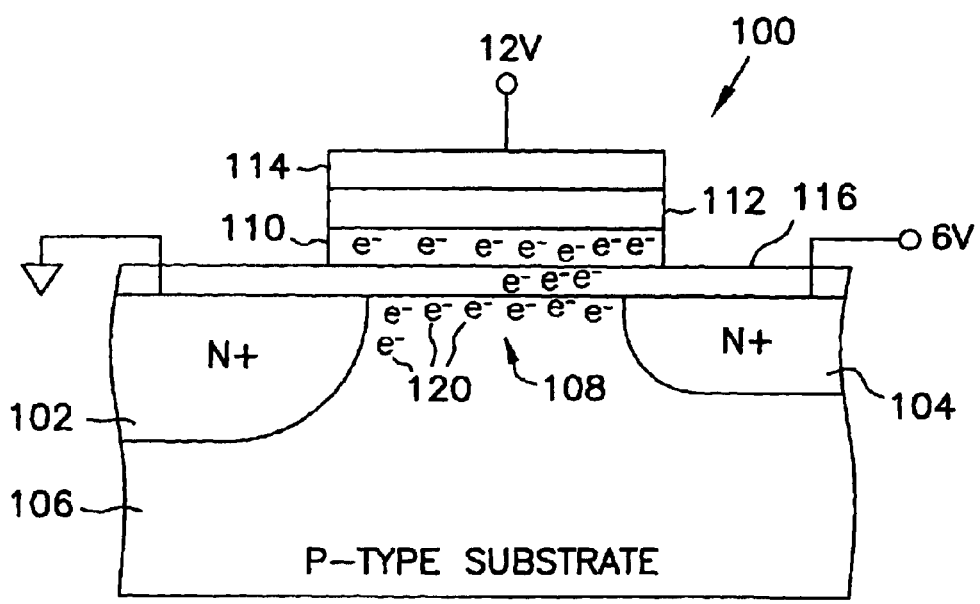
FIG. 2 is the memory cell of FIG. 1 during programming.

FIG. 2 is the memory cell of FIG. 1 during a programming operation. During programming, a positive programming voltage of about 12 volts is applied to control gate 114. This positive programming voltage attracts electrons 120 from P-type substrate 106 and causes them to accumulate at the surface of channel region 108. A voltage on drain 104 is increased to about 6 volts, and the source 102 is connected to ground. As the drain-to-source voltage increases, electrons 120 flow from source 102 to drain 104 via channel region 108. As electrons 120 travel toward drain 104, they acquire substantially large kinetic energy and are referred to as hot electrons.

The voltages at control gate 114 and drain 104 creates an electric field in oxide layer 116, this electric field attracts the hot electrons and accelerates them toward the floating gate 110. At this point, floating gate 110 begins to trap and accumulate the hot electrons and starts a charging process. Gradually, as the charge on the floating gate increases, the electric field in oxide layer 116 decreases and eventually loses it capability of attracting any more of the hot electrons to floating gate 110. At this point, floating gate 110 is fully charged. The negative charge from the hot electrons collected in the floating gate 110 raises the cell's threshold voltage (Vt) above a logic 1 voltage. When a voltage on control gate 114 is brought to a logic 1 during a read operation, the cell will barely turn on. Sense amplifiers are used in the memory to detect and amplify the state of the memory cell during a read operation. Thus, data is read from a memory cell based upon its "on" characteristics.

Electrons are removed from the floating gate to erase the memory cell. Many memories, including flash memories, use Fowler-Nordheim (FN) tunneling to erase a memory cell. The erase procedure is accomplished by electrically floating the drain, grounding the source, and applying a high negative voltage (−12 volts) to the control gate. This creates an electric field across the gate oxide and forces electrons off of the floating gate which then tunnel through the gate oxide. For a general description of how a flash memory having floating gate memory cells operates see B. Dipert et al., "Flash Memory Goes Mainstream," IEEE Spectrum, pp. 48–52 (October 1993), and incorporated herein by reference.

One of the difficulties with flash memories has been the erase operation using Fowler-Nordheim tunneling. The erase operation requires high voltages, and is relatively slow. Further, an erratic over erase can be induced as a result of the very high erase voltages used. These very high erase voltages are a fundamental problem arising from the high electron affinity of bulk silicon or large grain polysilicon particles used as the floating gate. This creates a very high tunneling barrier. Even with high negative voltages applied to the gate, a large tunneling distance is experienced with a very low tunneling probability for electrons attempting to leave the floating gate. This results in long erase times since the net flux of electrons leaving the gate is low. Thus, the tunneling current discharging the gate is low. In addition, other phenomena result as a consequence of this very high negative voltage. Hole injection into the oxide is experienced which can result in erratic over erase, damage to the gate oxide itself, and the introduction of trapping states.

The solution to these problems is to use a floating gate having a lower electron affinity for electrons. Thus, a lower barrier is provided for electrons to escape over, or through by tunneling. Lower barriers require lower voltages and result in smaller tunneling distances for the electrons during the erase operation. This results in much faster erase times and much less damage. The possibility of a secondary problem occurring in the gate oxide are also reduced, such as electron traps and hole injection.

The present invention describes the use of nanocrystalline silicon films as a floating gate in flash memories rather than the large bulky and thick polysilicon normally used. The nanocrystalline silicon films form in silicon rich oxide after silicon implantation into the oxide and appropriate anneal conditions. The silicon crystals can be made in a variety of sizes with a uniform distribution in particle sizes by appropriate anneal conditions. Although the particles may not be formed in a uniform sphere, they can be described as having a general diameter of approximately 10 Å to 100 Å. They can also be formed by chemical vapor deposition, by rapid thermal anneal of amorphous silicon layers or by other known techniques.

The primary advantage of a nanocrystalline film floating gate is that these nano-scale particles have a larger bandgap than bulk silicon due to confinement in the small particles. A quantum mechanical effect is experienced which results in a different band structure and widening of the bandgap. A wider bandgap results in a lower barrier for the electrons at the surface of the silicon particle and a much larger tunneling probability when negative potentials are applied during the write operation. The barrier of course can not be made too small or electrons might be thermally excited over the barrier at high operating temperatures and the stored charge leak off of the floating gate in long time periods at high temperature. Normally this is not a problem in flash memories, the barrier is so high as to result in extremely long retention times, far in excess of any requirement. The problem is that the barrier is too high and results in FN tunneling discharge times which are too long and require voltages which are too high. Reducing the barrier between the silicon gate particles and the gate oxide serves to significantly improve flash memories. These nanocrystalline silicon films are quite conductive even when intrinsic and can be made more conductive by the appropriate doping as is done with larger grain polysilicon films currently used as the gate structure in flash memories. These floating gate films, however, need not be very conductive since they are not used elsewhere for wiring and need only be conductive enough to allow for a redistribution of carriers in the floating gate structure itself.

Figure 3:
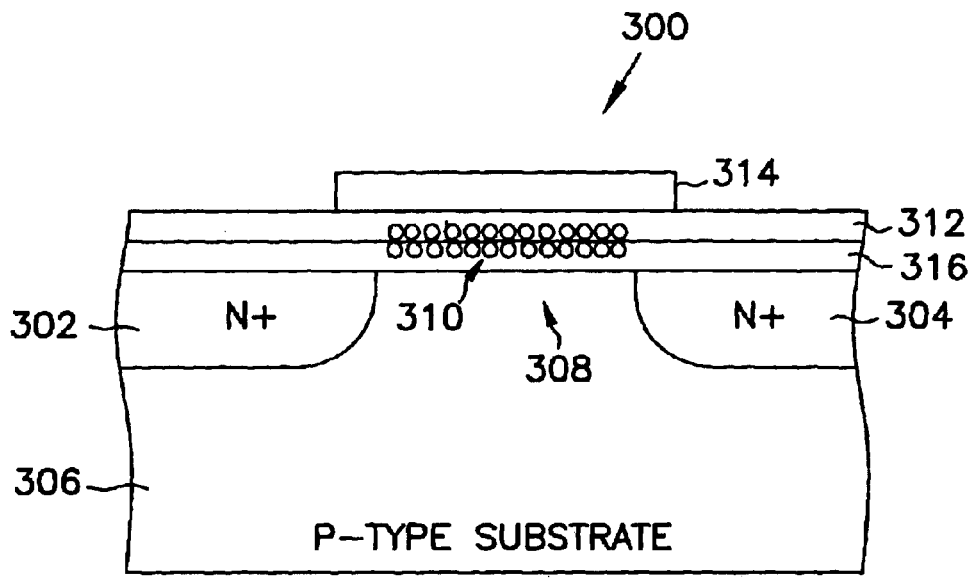
FIG. 3 is a cross-section of a memory cell incorporating a film of nanocrystalline silicon as a floating gate.

FIG. 3 is a cross-sectional view of a transistor 300 of the present invention. Transistor 300 comprises a region of a source 302 and a region of a drain 304. Source 302 and drain 304 are constructed from an N+ type of high impurity concentration which are formed in a P-type semiconductor substrate 306 of low impurity concentration. Source 302 and drain 304 are separated by a predetermined space of a channel region 308. Transistor 300 further includes a floating gate 310 formed as a silicon nanocrystalline film. A control gate 314 is formed by a polysilicon layer. Floating gate 310 is isolated from control gate 314 by an interpoly dielectric layer 312 and from channel region 308 by a thin gate oxide layer 316. The floating gate silicon nanocrystalline film is comprised of nanocrystalline particles which can be embedded in either dielectric layer 312 or 316. These particles have a diameter in the size range of approximately 10 Å to 100 Å and are in a uniform size distribution for a particular set of processing conditions. The particles are in contact with each other and form as a result of annealing the silicon rich oxide which follows silicon implantation into the gate oxide or deposition of silicon and appropriate anneal conditions to grow nanocrystalline particles of silicon which then form a film. This film is patterned using standard techniques known to those skilled in the art to form the floating gates. When used as a memory cell, the drain of the transistor is typically coupled to a bit line, and the control gate is coupled to a word line.

Using these silicon nanocrystals in a conductive film is distinctly different than other techniques of using isolated silicon nanocrystals to observe trapping of single electrons on these isolated crystals, as described above. Here the nanocrystals are used as a conductive film to replace the coarse grain polysilicon floating gate structure in a conventional flash memory structured with hot electron injection as the write mechanism and tunneling as the erase mechanism.

Figure 4:
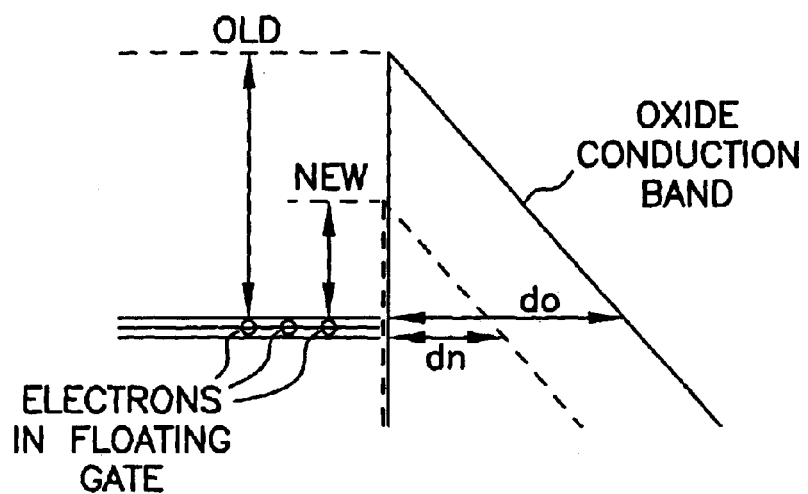
FIG. 4 is a graph of barrier height versus tunneling distance.

FIG. 4 illustrates how the smaller barrier at the surface of the floating gate silicon storing electrons results in a shorter tunneling distance through a gate oxide insulating layer and consequently a much higher tunneling probability. Tunneling distance "do" represents the tunneling distance experienced in typical transistor having a polysilicon floating gate. Tunneling distance "dn" represents the tunneling distance experienced in a transistor having a floating gate as described in FIG. 3. The tunneling probability is an exponential function of the reciprocal tunneling distance and even a small reduction in the tunneling distance results in tunneling probabilities which are orders of magnitude higher and tunneling time which are orders of magnitudes smaller.

The result then is a memory cell with a much faster and much easier erase operation due to the lower barrier height for the electrons to tunnel through in leaving the floating gate structures. Also, the thick polysilicon floating gate structure is replaced by a much thinner film of nanocrystals of silicon particles embedded in an oxide region. This results in a much more compact device, and a memory cell with a planar structure having less stray sidewall capacitive coupling.

Figure 5:
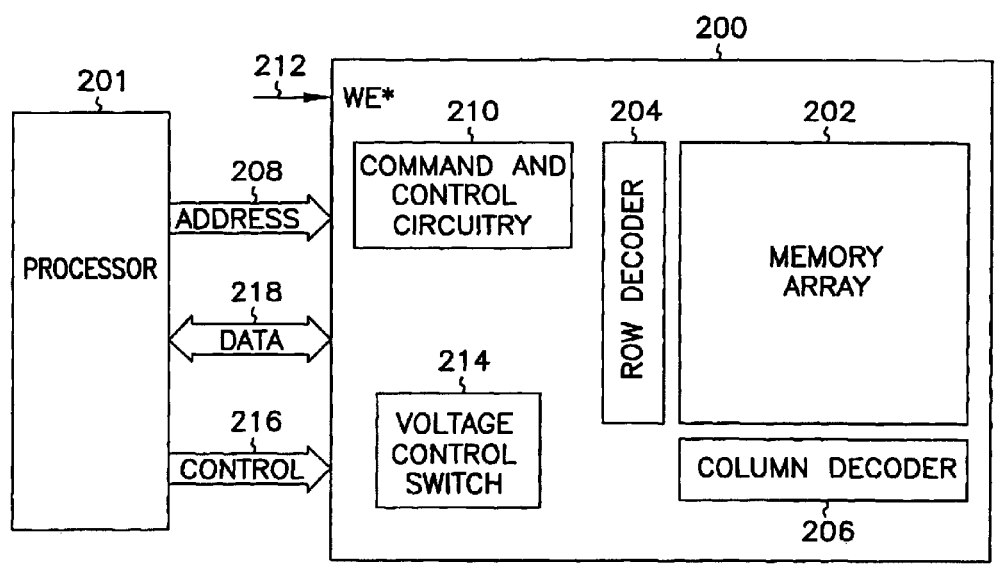
FIG. 5 is a simplified block diagram of a typical flash memory incorporating the present invention.

FIG. 5 is a simplified block diagram of a typical system having a flash memory incorporating the present invention. Memory 200 comprises a memory array 202 having memory cells. A row decoder 204 and a column decoder 206 are designed to decode and select addresses provided on address lines 208 to access appropriate memory cells. Command and control circuitry 210 is designed to control the operation of memory 200 in response to incoming command and control signals from a processor 201, including a write enable signal 212 (WE*), control lines 216 and data communication lines 218. Furthermore, a voltage control switch 214 is provided to apply appropriate voltages to the memory cells during programming operation. It will be appreciated by those skilled in the art that the memory of FIG. 5 has been simplified for the purpose of illustrating the present invention and is not intended to be a complete description of a flash memory.

CONCLUSION

A memory device is described which has fast read, write and erase operations. The memory uses memory cell floating gate transistors with a floating fabricated of a conductive layer of nano-size silicon crystals. Although the floating gate is conductive, it need only be conductive enough to allow for a redistribution of carriers in the floating gate structure itself. The memory cell has a lower electron affinity than conventional memory cells having a floating gate fabricated from polysilicon.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A transistor, comprising:
   a source region;
   a drain region;
   a conductive channel separating the source and drain regions; and
   a gate, including a film of nanocrystalline silicon particles in electrical contact with each other, the film located adjacent the channel and separated therefrom by an insulating layer.

2. The transistor of claim 1, wherein the nanocrystalline silicon particles have a general diameter of approximately 10 Å to 100 Å.

3. The transistor of claim 1, wherein the film of nanocrystalline silicon particles are embedded within the insulating layer.

4. The transistor of claim 1, wherein the insulating layer includes a silicon rich oxide layer.

5. A transistor, comprising:
   a source region;
   a drain region;
   a conductive channel separating the source and drain regions; and
   a gate, including a film of conductively doped nanocrystalline silicon particles in electrical contact with each other, the film located adjacent the channel and separated therefrom by an insulating layer.

6. The transistor of claim 5, wherein the nanocrystalline silicon particles have a general diameter of approximately 10 Å to 100 Å.

7. The transistor of claim 5, wherein the film of nanocrystalline silicon particles are embedded within the insulating layer.

8. The transistor of claim 5, wherein the insulating layer includes a silicon rich oxide layer.

9. A memory device, comprising:
   a number of memory cells, wherein at least a portion of the memory cells include:
   a source region;
   a drain region;
   a conductive channel separating the source and drain regions; and
   a gate, including a film of nanocrystalline silicon particles in electrical contact with each other, the film located adjacent the channel and separated therefrom by an insulating layer.

10. The memory device of claim 9, wherein the nanocrystalline silicon particles have a general diameter of approximately 10 Å to 100 Å.

11. The memory device of claim 9, wherein the film of nanocrystalline silicon particles are embedded within the insulating layer.

12. The memory device of claim 9, wherein the memory device includes an electrically programmable read only memory (EPROM).

13. A memory device, comprising:
   a number of memory cells, wherein at least a portion of the memory cells include:
   a source region;
   a drain region;
   a conductive channel separating the source and drain regions; and
   a gate, including a film of conductively doped nanocrystalline silicon particles in electrical contact with each other, the film located adjacent the channel and separated therefrom by an insulating layer.

14. The memory device of claim 13, wherein the film of nanocrystalline silicon particles are embedded within the insulating layer.

15. The memory device of claim 13, wherein the memory device includes an electrically programmable read only memory (EPROM).

16. The memory device of claim 13, wherein the insulating layer includes a silicon rich oxide layer.

17. A flash memory cell, comprising:
   a source region;
   a drain region;
   a conductive channel separating the source and drain regions;
   a floating gate, including a film of nanocrystalline silicon particles in electrical contact with each other, the film located adjacent the channel and separated therefrom by a first insulating layer; and
   a control gate located adjacent the film and separated therefrom by a second insulating layer.

18. The flash memory cell of claim 17, wherein the nanocrystalline silicon particles have a general diameter of approximately 10 Å to 100 Å.

19. The flash memory cell of claim 17, wherein the film of nanocrystalline silicon particles are embedded within either the first or second insulating layer.

20. The flash memory cell of claim 17, wherein at least one insulating layer includes a silicon rich oxide layer.

21. A flash memory cell, comprising:
   a source region;
   a drain region;
   a conductive channel separating the source and drain regions;
   a floating gate, including a film of conductively doped nanocrystalline silicon particles in electrical contact with each other, the film located adjacent the channel and separated therefrom by a first insulating layer; and
   a control gate located adjacent the film and separated therefrom by a second insulating layer.

22. The flash memory cell of claim 21, wherein the nanocrystalline silicon particles have a general diameter of approximately 10 Å to 100 Å.

23. The flash memory cell of claim 21, wherein the film of nanocrystalline silicon particles are embedded within either the first or second insulating layer.

24. The flash memory cell of claim 21, wherein at least one insulating layer includes a silicon rich oxide layer.

25. A flash memory device, comprising:
   a number of flash memory cells, wherein at least a portion of the flash memory cells include:
   a source region;
   a drain region;
   a conductive channel separating the source and drain regions;
   a floating gate, including a film of conductively doped nanocrystalline silicon particles in electrical contact with each other, the film located adjacent the channel and separated therefrom by a first insulating layer; and
   a control gate located adjacent the film and separated therefrom by a second insulating layer.

26. The flash memory cell of claim 25, wherein the film of nanocrystalline silicon particles are embedded within either the first or second insulating layer.

27. The flash memory cell of claim 25, wherein at least one insulating layer includes a silicon rich oxide layer.

28. A transistor, comprising:
   a source region;
   a drain region;
   a conductive channel separating the source and drain regions; and
   a gate, including nanocrystalline silicon particles in electrical contact with each other, wherein the nanocrystalline silicon particles are located adjacent the channel and separated therefrom by an insulating layer.

29. The transistor of claim 28, wherein the nanocrystalline silicon particles are included in a film of nanocrystalline particles.

30. The transistor of claim 28, wherein the nanocrystalline silicon particles have a general diameter of approximately 10Å to 100Å.

31. The transistor of claim 28, wherein the nanocrystalline silicon particles are embedded within the insulating layer.

32. The transistor of claim 28, wherein the insulating layer includes a silicon rich oxide layer.

33. A memory cell, comprising:
   a source region;
   a drain region;
   a conductive channel separating the source and drain regions;
   a floating gate, including a number of nanocrystalline silicon particles in electrical contact with each other, wherein the number of nano crystalline silicon particles are located adjacent the channel and separated therefrom by a first insulating layer; and
   a control gate located adjacent to the floating gate and separated therefrom by a second insulating layer.

34. The transistor of claim 33, wherein the nanocrystalline silicon particles have a general diameter of approximately 10Å to 100Å.

35. The flash memory cell of claim 33, wherein the nanocrystalline silicon particles are embedded within either the first or second insulating layer.

36. A transistor, comprising:
   a source region;
   a drain region;
   a conductive channel separating the source and drain regions; and
   a gate, including a plurality of nanocrystalline silicon particles in electrical contact with each other, wherein the plurality of nanocrystalline silicon particles are located adjacent the channel and separated therefrom by an insulating layer.

37. The transistor of claim 36, wherein the nanocrystalline silicon particles have a general diameter of approximately 10Å to 100Å.

38. The transistor of claim 36, wherein the nanocrystalline silicon particles are embedded within the insulating layer.

39. A transistor, comprising:
    a source region;
    a drain region;
    a conductive channel separating the source and drain regions; and
    a gate, including a number of clusters of nanocrystalline silicon particles, wherein the nanocrystalline silicon particles are in electrical contact with each other, wherein the nanocrystalline silicon particles are located adjacent the channel and separated therefrom by an insulating layer.

40. The transistor of claim 39, wherein the nanocrystalline silicon particles have a general diameter of approximately 10Å to 100Å.

41. The transistor of claim 39, wherein the nanocrystalline silicon particles are embedded within the insulating layer.

42. The transistor of claim 39, wherein the insulating layer includes a silicon rich oxide layer.

* * * * *

UNITED STATES PATENT AND TRADEMARK OFFICE
CERTIFICATE OF CORRECTION

PATENT NO.    : 6,912,158 B2
DATED         : June 28, 2005
INVENTOR(S)   : Forbes It is certified that error appears in the above-identified patent and that said Letters Patent is hereby corrected as shown below:

Title page,
Item [75], Inventor, delete "Coryallis" and insert -- Corvallis --, therefor.
Item [56], References Cited, OTHER PUBLICATIONS,
"Dimaria" reference, delete "offs-toichiometric" and insert -- off-stoichiometric --, therefor;
"Edelbert" reference, delete "Edelbert" and insert -- Edelberg --, therefor, and delete "Proceedinigs" and insert -- Proceedings --, therefor;
"Shen" reference, insert -- ( -- before "Dec.";
"Sze" reference, delete "ork" and insert -- York --, therefor;
"Tiwari" reference, after "Volatile" delete ".";
"White" reference, insert -- ( -- before "Jun.".

Column 6,
Line 41, after "other" delete ",".

Column 8,
Line 43, delete "nano crystalline" and insert -- nanocrystalline --, therefor.

Signed and Sealed this

Twenty-ninth Day of November, 2005

JON W. DUDAS
*Director of the United States Patent and Trademark Office*